United States Patent [19]

Chapman et al.

[11] 4,281,275

[45] Jul. 28, 1981

[54] CIRCUIT FOR DRIVING DEFLECTION COIL

[75] Inventors: Peter Chapman, Gillingham; Martin W. Redfern, Maidstone, both of England

[73] Assignee: Elliott Brothers (London) Limited, Chelmsford, England

[21] Appl. No.: 73,520

[22] Filed: Sep. 7, 1979

[30] Foreign Application Priority Data

Sep. 12, 1978 [GB] United Kingdom ............... 36515/78

[51] Int. Cl.³ ............................................ H01J 29/70
[52] U.S. Cl. ................................... 315/399; 315/370; 315/406; 315/408
[58] Field of Search ................ 315/406, 408, 399, 370

[56] References Cited

U.S. PATENT DOCUMENTS

| 3,714,503 | 1/1973 | West | 315/408 X |
|---|---|---|---|
| 3,766,314 | 10/1973 | Riechmann | 315/406 X |
| 3,796,827 | 3/1974 | Riechmann | 315/408 X |
| 3,824,427 | 7/1974 | McLeod, Jr. | 315/399 X |

Primary Examiner—Malcolm F. Hubler
Attorney, Agent, or Firm—Kirschstein, Kirschstein, Ottinger & Cobrin

[57] ABSTRACT

A circuit for driving a deflection coil comprising a capacitor (3) in series with the coil (2), a circuit (1) which drives a saw-tooth waveform current through the coil and capacitor, and a switchable resonant circuit (5, 6, 7, 8, 9) which generates across the capacitor a saw-tooth waveform voltage equal and opposite to the voltage drop attributable to a resistive component (4) of the capacitor/coil series circuit, thereby to effect loss correction.

7 Claims, 6 Drawing Figures

CIRCUIT FOR DRIVING DEFLECTION COIL

This invention relates to circuits for driving deflection coils e.g. a coil for scanning an electron beam across the screen of a cathode ray tube (CRT).

In order to achieve a CRT spot deflection which is linear with time across the CRT screen a complex voltage waveform across the deflection coil is required.

Three components of the waveform may be identified:
(a) a d.c. component;
(b) a parabolic component for CRT screen shape correction; and
(c) a ramp component for loss correction Absence of the last mentioned component has the effect of progressive gradual reduction of the spot velocity as each scan proceeds and the picture is accordingly cramped towards one side of the CRT screen.

One or the other of two methods is conventionally used to introduce the loss correction component in the deflection coil voltage waveform.

In one method a linear feedback amplifier is used to control the deflection coil voltage during forward scan. In the other method a non-linear inductor is connected in series with the deflection coil. By this means an approximate ramp voltage is produced by the varying deflection coil current.

Of these two methods it may be stated that the linear system is accurate but wasteful of power whilst the non-linear inductor method is relatively loss-free but results in a poorly defined accuracy and in difficulties in electrical control in response to variation of circuit losses with time and temperature.

It is an object of the present invention to provide a circuit for driving a deflection coil by which the required loss correction is obtained in a substantially loss-free manner without the above-mentioned poorly defined accuracy and control difficulties.

According to the invention a circuit for driving a deflection coil comprises: a capacitor forming a series L-C circuit with the deflection coil; a drive circuit to produce a current of saw-tooth waveform through the series L-C circuit; and a switchable resonant circuit for generating across the capacitor of the said series L-C circuit a saw-tooth waveform voltage component which is substantially equal and opposite to the voltage drop attributable to a resistive component of the L-C circuit.

In one particular arrangement according to the invention the driving circuit includes a sensing circuit for sensing the current flowing in the inductor of the L-C circuit; and a control circuit to control the amplitude of said saw-tooth waveform voltage component in response to the output of the sensing circuit so as to produce substantial symmetry of the sensed inductor sawtooth current.

One circuit in accordance with the invention and a modification thereof will now be described by way of example with reference to the accompanying drawings in which.

Figure 1:
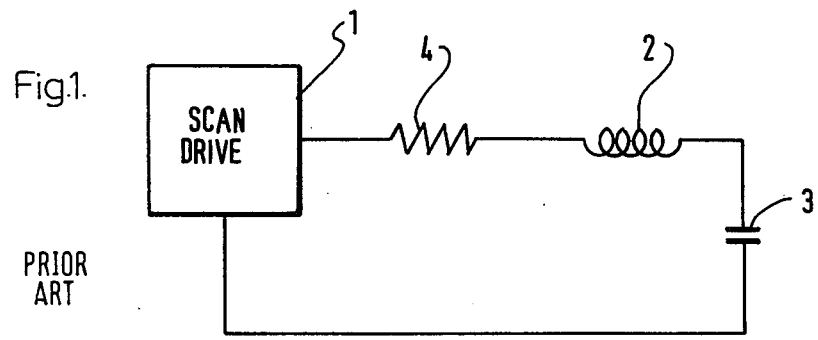
FIG. 1 is a schematic circuit diagram of a conventional CRT scanning coil driving coil.

Referring to FIG. 1, a conventional CRT scanning coil drive circuit comprises a scan drive circuit 1 connected with a scanning coil 2, and an a.c. coupling capacitor 3 which produces the required parabolic component of the voltage across the coil 2. Resistive losses in the L-C circuit 2, 3 are represented by resistor 4.

Figure 2:
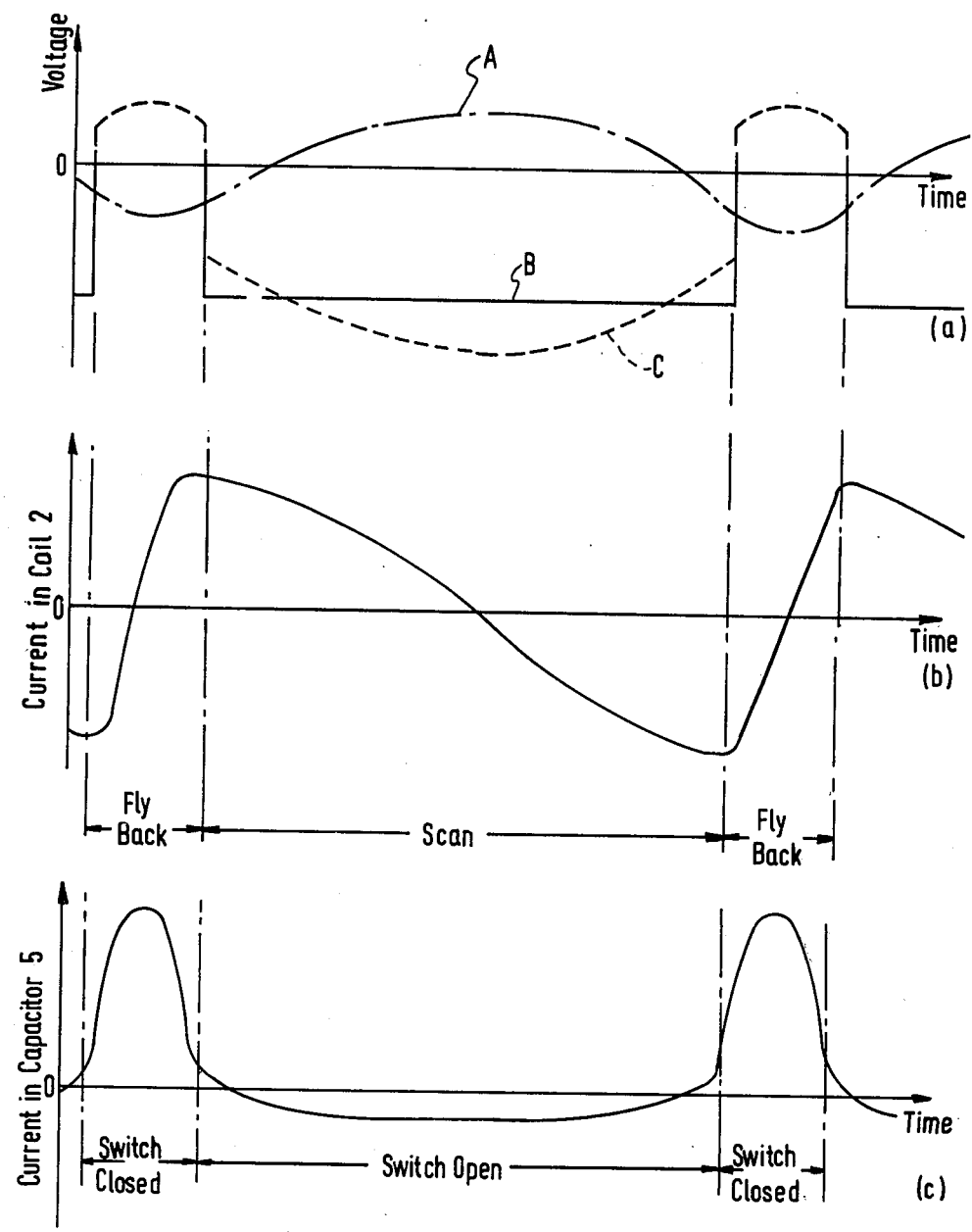
FIG. 2 illustrates various waveforms occurring in operation of the circuit of FIG. 1.

FIG. 2a shows the voltage waveforms present in the circuit of FIG. 1 for an idealized circuit, i.e. in which the resistor 4 has zero resistance, line A representing the parabolic voltage component occurring across capacitor 3, line B representing the drive voltage supplied by circuit 1, and line C representing the resultant ideal voltage across coil 2. FIG. 2b shows the waveform of the resulting current through the coil 2. If resistor 4 has a finite value the resistive loss effectively generates a voltage waveform of the shape shown in FIG. 2b. The loss component of the waveform can therefore be cancelled by supplying an equal and opposite voltage waveform in series with the coil 2.

Figure 3:
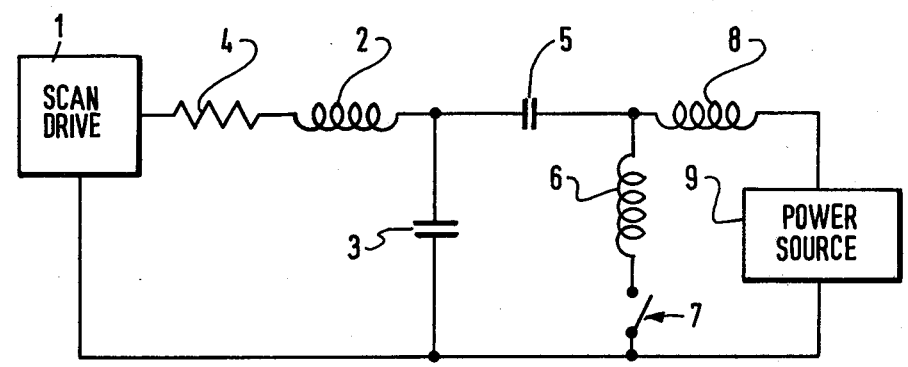
FIG. 3 shows schematically a circuit in accordance with the invention.

In accordance with the invention the required voltage is generated across the capacitor 3 by the additional circuitry shown in FIG. 3.

As may be seen the additional circuitry comprises a capacitor 5 and inductor 6 and a switch 7 connected in series across the capacitor 3, and an inductor 8 connected in series with a d.c. power source 9 across the series connected inductor 6 and switch 7.

The resonant circuit comprising capacitors 3 and 5 and inductor 8 resonates at substantially the same frequency as the circuit comprising capacitor 3 and inductor 4 of FIG. 1.

The circuit comprising capacitors 3 and 5 and inductor 6 forms, with switch 7 closed, a resonant circuit having a half period approximately equal to the desired CRT scanning flyback period.

During forward scan the switch 7 is open and the current through capacitor 5 and inductor 8 from source 9 generates a compensatory ramp voltage component across capacitor 3 of the required shape in relation to the current waveform through the deflection coil 2.

At the completion of the forward scan the switch 7 closes and a resonant current pulse flows through the components 3, 5, 6 and 7. At the end of a half cycle of oscillation the switch 7 re-opens, having reset the voltage across capacitor 3 to its initial start-of-forwardscan value. The current flowing in capacitor 5 and, hence, the compensatory current in capacitor 3 is shown in FIG. 2c.

The magnitude of the compensatory voltage waveform is determined by the power source 9.

Figure 4:
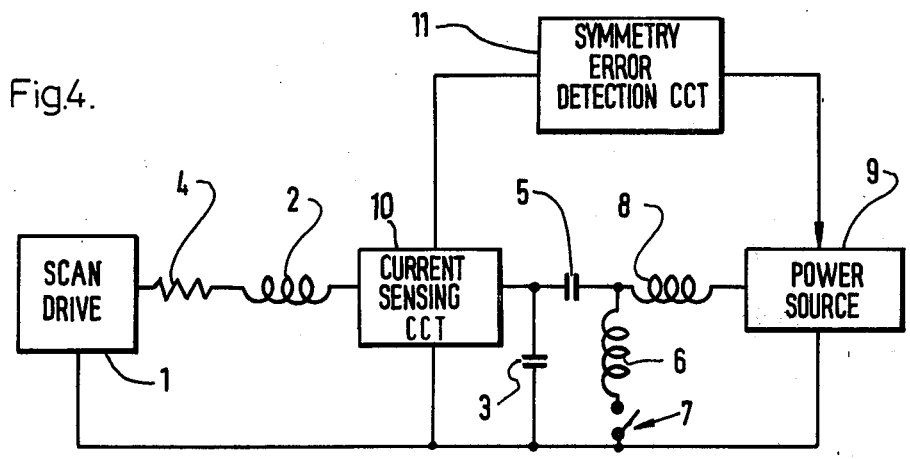
FIG. 4 shows schematically a modified form of the circuit of FIG. 3.

The power source 9 may comprise a capacitor in parallel with a current source thereby providing good stability if the losses are substantially constant. Alternatively the power source 9 may be made responsive to the output of a symmetry error detection circuit, as illustrated in FIG. 4. Here a symmetry error detection circuit 11 is fed from a circuit 10 which senses the current in coil 2. The output of the circuit 11, in response to the signal from the sensing circuit 10, controls the power source 9 so as to achieve symmetry of the current in coil 2.

Figure 5:
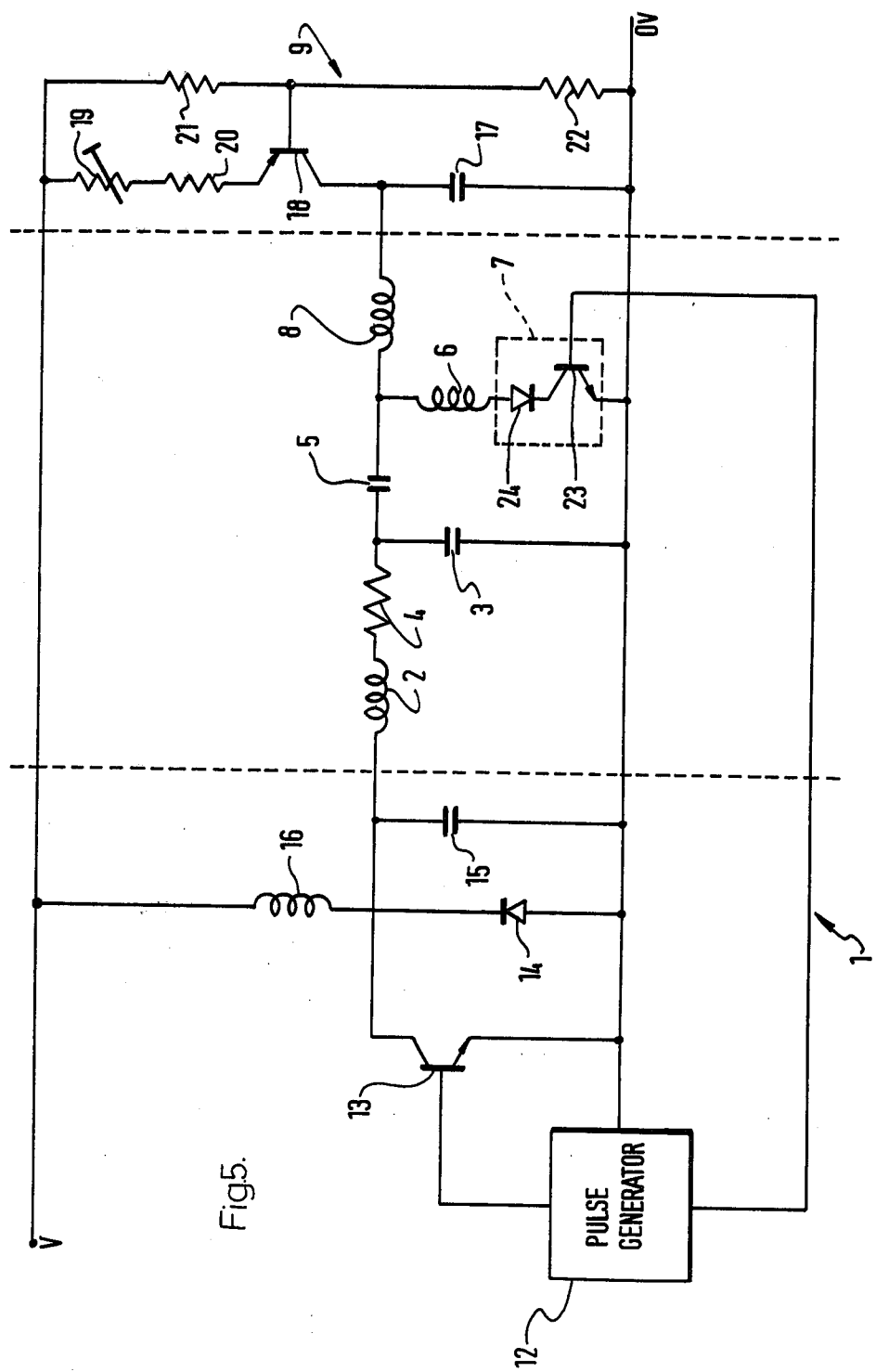
FIG. 5 shows schematically a practical implementation of the circuit of FIG. 3.

FIG. 5 shows a practical embodiment of the circuit of FIG. 3 employing the first mentioned power source possibility. In this embodiment the drive circuit 1 comprises a well-known resonant energy recovery circuit, widely used, e.g. in TV circuits, comprising a pulse generator 12, a transistor switch 13, a commutation diode 14, and a resonance tuning capacitor 15 all supplied with power by way of a choke 16 from a source (not shown) of voltage V.

The power source 9 comprises a capacitor 17 in parallel with a current generator consisting of a power transistor 18 and a resistive network 19, 20, 21 and 22, the resistor 19 being adjustable for setting deflection coil current symmetry.

The switch 7 comprises a transistor 23 connected in series with the inductor 6 via a rectifying diode 24 and controlled by a suitable voltage derived from the pulse generator 12.

Figure 6:
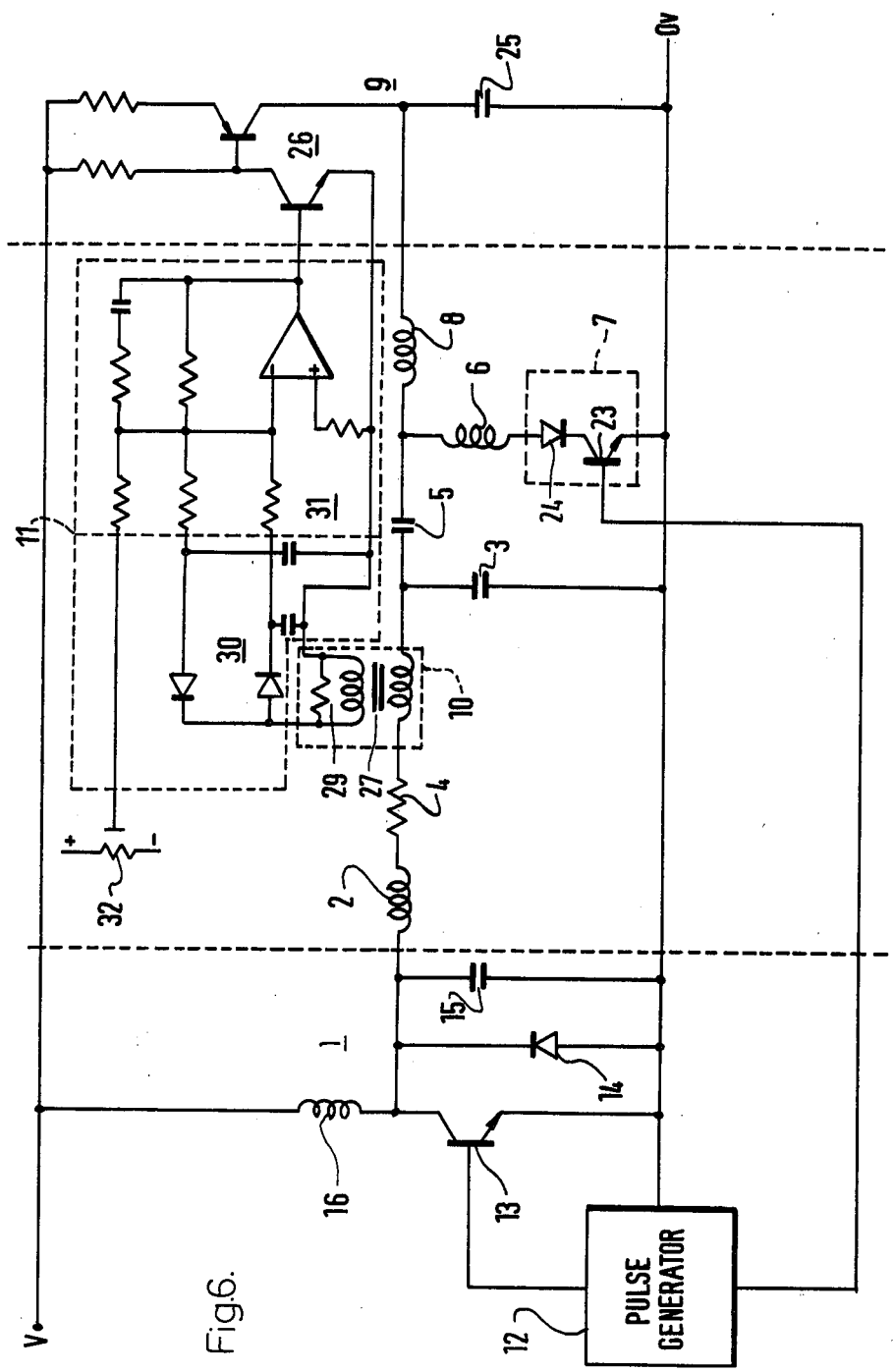
FIG. 6 shows schematically a practical implementation of the circuit of FIG. 4.

FIG. 6 shows a practical embodiment of the circuit of FIG. 4. The scan drive circuit 1 is the same as for FIG. 5. The power source 9 comprises capacitor 25 and a two stage transistor circuit 26.

The current sensing circuit 10 comprises a current transformer 27 which generates across a resistive load 29 a voltage corresponding to the deflection coil current. This voltage is peak detected by a capacitor/diode network 30 forming part of the symmetry error detector circuit 11. The resulting positive and negative peak voltages are summed in a summing and amplifying network 31 connected with a "set symmetry" potentiometer 32. The output of the network 31 is a symmetry error signal.

We claim:

1. A circuit for driving a deflection coil comprising: a capacitor forming a series L-C circuit with the deflection coil; a drive circuit to produce a current of saw-tooth waveform through the series L-C circuit; and a switchable resonant circuit connected across the capacitor of the said series L-C circuit to produce across said capacitor a saw-tooth waveform voltage component which is substantially equal and opposite to the voltage drop attributable to a resistive component of the L-C circuit.

2. A circuit according to claim 1 wherein said switchable resonant circuit comprises a capacitor, a first inductor and a switch means connected in series across the capacitor of said L-C circuit, and a second inductor connected in series with a power source across the series connection of said first inductor and said switch means, the capacitor of the L-C circuit together with the capacitor and second inductor of said switchable resonant circuit forming a circuit which resonates at substantially the same frequency as the L-C circuit, and the capacitor of the L-C circuit together with the capacitor and the first inductor of the switchable resonant circuit forming, with the switch means closed, a resonant circuit having a half period substantially equal to the flyback period of the saw-tooth waveform.

3. A circuit according to claim 2 wherein said power source comprises a capacitor in parallel with a current source.

4. A circuit according to claim 1 including a sensing circuit for sensing the current flowing in the inductor of the L-C circuit; and a control circuit to control the amplitude of said saw-tooth waveform voltage component in response to the output of the sensing circuit so as to produce substantial symmetry of the sensed inductor saw-tooth current.

5. A circuit according to claim 4 wherein the sensing circuit comprises a current transformer having a resistive load.

6. A circuit according to claim 4 wherein said control circuit comprises a symmetry error detecting circuit responsive to the output of the sensing circuit.

7. A circuit according to claim 6 wherein said symmetry error detecting circuit comprises a peak detector circuit for detecting the positive and negative peaks of the sensing circuit output and a summing circuit responsive to the output of the peak detector circuit.

* * * * *